United States Patent
Momtaz

(10) Patent No.: US 6,993,106 B1
(45) Date of Patent: Jan. 31, 2006

(54) FAST ACQUISITION PHASE LOCKED LOOP USING A CURRENT DAC

(75) Inventor: Afshin Momtaz, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 757 days.

(21) Appl. No.: 09/614,308

(22) Filed: Jul. 12, 2000

Related U.S. Application Data

(63) Continuation-in-part of application No. 09/540,243, filed on Mar. 31, 2000, now Pat. No. 6,526,113.
(60) Provisional application No. 60/148,379, filed on Aug. 11, 1999, provisional application No. 60/148,417, filed on Aug. 11, 1999, and provisional application No. 60/148,418, filed on Aug. 11, 1999.

(51) Int. Cl.
*H03D 3/24* (2006.01)

(52) U.S. Cl. .......................... 375/376; 375/354
(58) Field of Classification Search .............. 375/376, 375/354, 373; 331/16, 17, 25; H03L 7/089; H04B 1/40
See application file for complete search history.

(56) References Cited

U.S. PATENT DOCUMENTS

| | | | | |
|---|---|---|---|---|
| 5,065,408 A | * | 11/1991 | Gillig | 375/222 |
| 5,339,050 A | * | 8/1994 | Llewellyn | 331/16 |
| 5,382,921 A | * | 1/1995 | Estrada et al. | 331/1 A |
| 5,384,502 A | | 1/1995 | Volk | |
| 5,389,899 A | | 2/1995 | Yahagi et al. | |
| 5,400,372 A | | 3/1995 | Watanabe et al. | |

(Continued)

FOREIGN PATENT DOCUMENTS

| | | |
|---|---|---|
| EP | 0782271 A | 7/1997 |
| WO | WO 99/21283 A | 4/1999 |

OTHER PUBLICATIONS

Prorakis, John et al.; *Digital Signal Processing Principles, Algorithms, and Applications*; MacMillan Publishing Co.; pp. v. vi, 345,350 10 pp. 1992.
Co-pending U.S. Appl. No. 10/318,586, filed Dec. 13, 2002, entitled GM Cell Based Control Loops.
Co-pending U.S. Appl. No. 10/822,400, entitled GM Cell Based Control Loops, filed Apr. 12, 2004.
Supplemental European Search Report for EP00959205, dated Nov. 9, 2004.

*Primary Examiner*—Chieh M. Fan
*Assistant Examiner*—Jason M. Perilla
(74) *Attorney, Agent, or Firm*—Christie, Parker & Hale, LLP

(57) ABSTRACT

In a phase locked loop in which a phase detector compares an input signal to a reference signal and provides a difference signal to a charge pump or to a transconductance amplifier, a digital to analog converter is provided for connecting the output of the charge pump or transconductance amplifier to a voltage controlled oscillator whereby loop bandwidth can be increased from an operating value to an acquisition value for loop phase acquisition by changing the input to the DAC, thereby changing the amplification of the DAC.

24 Claims, 4 Drawing Sheets

U.S. PATENT DOCUMENTS

| | | |
|---|---|---|
| 5,406,631 A | 4/1995 | Takeda et al. |
| 5,436,597 A | 7/1995 | Dunlap et al. |
| 5,479,126 A | 12/1995 | Pan et al. |
| 5,495,512 A | 2/1996 | Kovacs et al. |
| 5,548,829 A | 8/1996 | Suzuki et al. |
| 5,564,089 A | 10/1996 | Barrett, Jr. |
| 5,570,398 A | 10/1996 | Smith |
| 5,572,163 A | 11/1996 | Kimura et al. |
| 5,654,675 A * | 8/1997 | Bruccoleri et al. ............ 331/17 |
| 5,659,588 A | 8/1997 | Fiedler |
| 5,696,468 A * | 12/1997 | Nise .............................. 331/14 |
| 5,726,607 A * | 3/1998 | Brede et al. .................... 331/2 |
| 5,757,216 A | 5/1998 | Murata |
| 5,783,971 A | 7/1998 | Dekker |
| 5,831,482 A * | 11/1998 | Salvi et al. ................. 331/1 R |
| 5,831,483 A | 11/1998 | Fukuda |
| 5,854,575 A | 12/1998 | Fiedler et al. |
| 5,864,249 A * | 1/1999 | Shoji ........................... 327/156 |
| 5,867,333 A | 2/1999 | Saiki et al. |
| 5,883,533 A * | 3/1999 | Matsuda et al. ............. 327/156 |
| 5,920,233 A | 7/1999 | Denny |
| 5,936,441 A * | 8/1999 | Kurita ........................ 327/141 |
| 5,942,949 A | 8/1999 | Wilson et al. |
| 5,983,077 A | 11/1999 | Dent |
| 6,011,440 A | 1/2000 | Bell et al. |
| 6,049,255 A * | 4/2000 | Hagberg et al. .............. 331/17 |
| 6,057,739 A | 5/2000 | Crowley et al. |
| 6,140,853 A | 10/2000 | Lo |
| 6,211,743 B1 | 4/2001 | Rhee et al. |
| 6,229,362 B1 | 5/2001 | Choi |
| 6,271,711 B1 | 8/2001 | Shenoy |
| 6,389,092 B1 | 5/2002 | Momtaz |
| 6,526,113 B1 | 2/2003 | Gutierrez et al. |
| 6,549,599 B2 | 4/2003 | Momtaz |

* cited by examiner

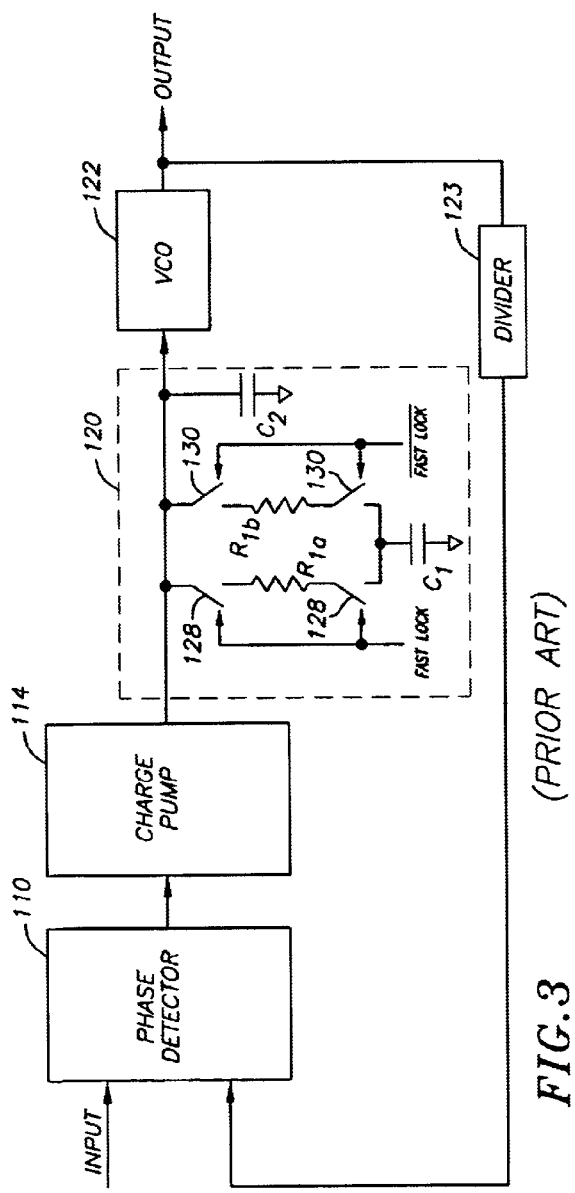
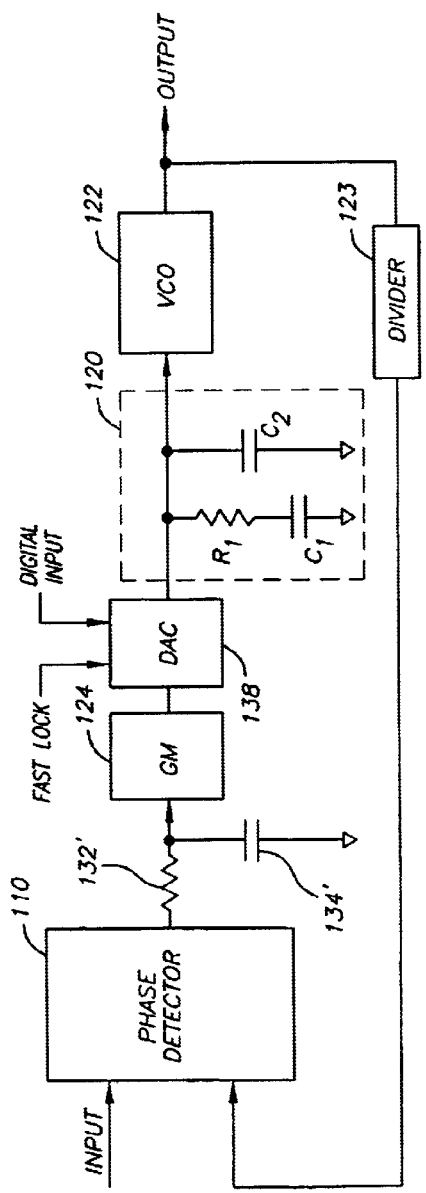
FIG.3 (PRIOR ART)
FIG.4

FAST ACQUISITION PHASE LOCKED LOOP USING A CURRENT DAC

CROSS-REFERENCES TO RELATED APPLICATIONS

This application is a continuation-in-part of U.S. application Ser. No. 09/540,243, filed on Mar. 31, 2000, now U.S. Pat. No. 6,526,113, which claims the benefit of Provisional Application Nos. 60/148,379, 60/148,417, and 60/148,418, all filed on Aug. 11, 1999, the content of all of which are incorporated herein by reference.

BACKGROUND OF THE INVENTION

This invention relates generally to electronic circuits, and more particularly the invention relates to phase locked loops which employ transconductance amplifiers and charge pumps.

A phase locked loop (PLL) is commonly used in many electronics applications to maintain a fixed phase relationship between an input (e.g., clock) signal and a reference signal. A phase locked loop designed for a digital application typically includes a phase and/or frequency detector, a charge pump, a loop filter, a VCO, and an (optional) divider. The phase detector determines the phase differences between an input signal (i.e., an input data stream or an input clock) and a reference signal derived from the VCO, and generates a detector output signal indicative of the detected phase differences. The charge pump receives the detector output signal and generates a set of phase error signals (e.g., UP and DOWN). The loop filter filters the phase error signals to generate a control signal that is then used to adjust the frequency of the VCO such that the frequencies of the two signals provided to the phase detector are locked.

FIG. 1 is a block diagram of a conventional phase locked loop 100. An input signal is provided to a phase detector 110 that also receives a reference signal from a divider 123. The input signal can be a clock signal, a data stream, or some other types of signal having phase and/or frequency information to which the phase locked loop can locked. The reference signal is typically a clock signal used to trigger the phase detector. Phase detector 110 generates an output signal PDOUT indicative of the timing differences (i.e., the phase differences) between the input signal and the reference signal. The PDOUT signal is provided to a charge pump 114 that generates an output signal CPOUT indicative of the detected phase error between the input and reference signals. In some designs, the PDOUT signal is logic high if the phase of the input signal is early (or late) relative to that of the reference signal, logic low if the phase of the input signal is late (or early) relative to that of the reference signal, and tri-stated for a period of time between clock edges.

The CPOUT signal is provided to a loop filter 120 that filters the signal with a particular transfer characteristic to generate a control signal. The control signal is then provided to, and used to control the frequency of, a voltage-controlled oscillator (VCO) 122. VCO 122 generates an output clock CLK_OUT having a frequency that is locked to that of the input signal (when the phase locked loop is locked). The output clock is provided to divider 123 that divides the frequency of the output clock by a factor of N to generate the reference signal. Divider 123 is optional and not used when the frequency of the output clock is the same as that of the input signal (i.e., N=1). The control signal adjusts the frequency of VCO 122 such that the frequencies of the two signals provided to phase detector 110 are locked.

The charge pump typically requires an input signal having rail-to-rail signal swing and sharp edges. Signals meeting these requirements can be readily provided by a phase detector at (relatively) low operating frequencies. However, at higher frequencies (e.g., 2.488 GHz for a SONET OC-48 transceiver), it is difficult to design a phase detector having rail-to-rail signal swing and sharp edges. To provide the required signal characteristics, the phase detector would typically need to be designed using a combination of large die area and large amounts of bias current. Besides the design challenge for such phase detector, the rail-to-rail signal swing and sharp edges generate large amounts of noise that can degrade the performance of the phase locked loop and other nearby circuits.

Disclosed in application Ser. No. 09/540,243, supra, is a locked loop for use in a high frequency application such as an optical transceiver. As shown in FIG. 2, the locked loop includes a detector 110, a transconductance (gm) amplifier 124, a loop filter 120, and an oscillator 122. The detector (which can be a phase detector or a frequency detector, or combination of both) receives an input signal and a reference signal and provides a detector output signal indicative of the difference between the input and reference signals. The difference can be phase or frequency, etc., depending on the application. The gm amplifier receives and converts the detector output signal to a current signal. The loop filter receives and filters the current signal with a particular transfer function to provide a control signal. The oscillator receives the control signal and provides an oscillator signal (e.g., a clock) having a property (e.g., frequency) that is adjusted by the control signal. Resistor 132 and shunt capacitor 134 represent a second loop pole at a high frequency which is normally overlooked in circuit analysis.

Acquisition time (or settling time) of a PLL is inversely proportional to its bandwidth. In general, for a PLL with passive filter, the bandwidth, W0, can be expressed in terms of VCO gain, Kvco, the filter primary resistor, R1, and the gain of phase detector/charge pump block, K1 (FIG. 1).

$$W0 = K1*R1*Kvco$$

In the case of gm based PLL (FIG. 2), this equation still applies where K1 represents the product of phase detector gain, Kpd, and gm cell's, gm. K1=Kpd*gm. Hence: W0=Kpd*gm*R1*Kvco.

Heretofore, to change the bandwidth, W0, switches have been needed to connect and disconnect appropriate resistors in order to change resistance R1 in the loop filter 120, as shown in FIG. 3 with switches 128 for fast lock and switches 130 for normal operation. However, these switches are connected to the most sensitive part of the phase lock loop, namely the VCO control voltage terminal. Any noise on this node translates directly to jitter at the output of the PLL. Each time these switches are turned on and off, charge is injected on this sensitive node. Further, since the resistance R1 depends on the resistivity parameter and Ron depends on MOSFET switch parameters, and since these parameters can vary from one wafer to another wafer independently, the worst case variation on the effective R1 is increased.

The present invention is directed to avoiding these limitations of the prior art phase lock loops.

SUMMARY OF THE INVENTION

In accordance with the present invention, a digital to analog converter, DAC, is used in a phase locked loop with either a charge pump or a transconductance amplifier whereby bandwidth of the loop can be readily changed without changing resistance in the loop filter. The digital input to the DAC can be increased to increase the bandwidth and shorten settling times. As soon as the acquisition is completed, a new set of digital inputs is provided to the DAC, so that the PLL is back to its original bandwidth, which is required for jitter characteristics. A digital signal, "fast lock," is provided at the input of the chip for instruction when the PLL should be in the fast acquisition mode, and when the PLL should switch back to its normal operating mode.

Accordingly, the need for switches in the loop filter is eliminated, thus reducing a source of noise and jitter. Further, the zero and pole of the phase lock loop is not varied since the filter resistance is not varied. Additionally, variations and resistances due to changing parameters from one semiconductor wafer to another is eliminated with the elimination of the switches.

The invention and objects and features thereof will be more readily apparent from the following detailed description and dependent claims when taken with the drawings.

BRIEF DESCRIPTION OF THE DRAWINGS

FIG. 3 is a functional block diagram of the phase lock loop circuit of FIG. 1 showing more details of the loop filter and switches used therein in accordance with the prior art.

FIG. 4 is a functional block diagram of a phase lock loop using a DAC in accordance with one embodiment of the invention.

Like elements in the several figures have the same reference numerals.

DETAILED DESCRIPTION OF ILLUSTRATIVE EMBODIMENTS

Figure 1:
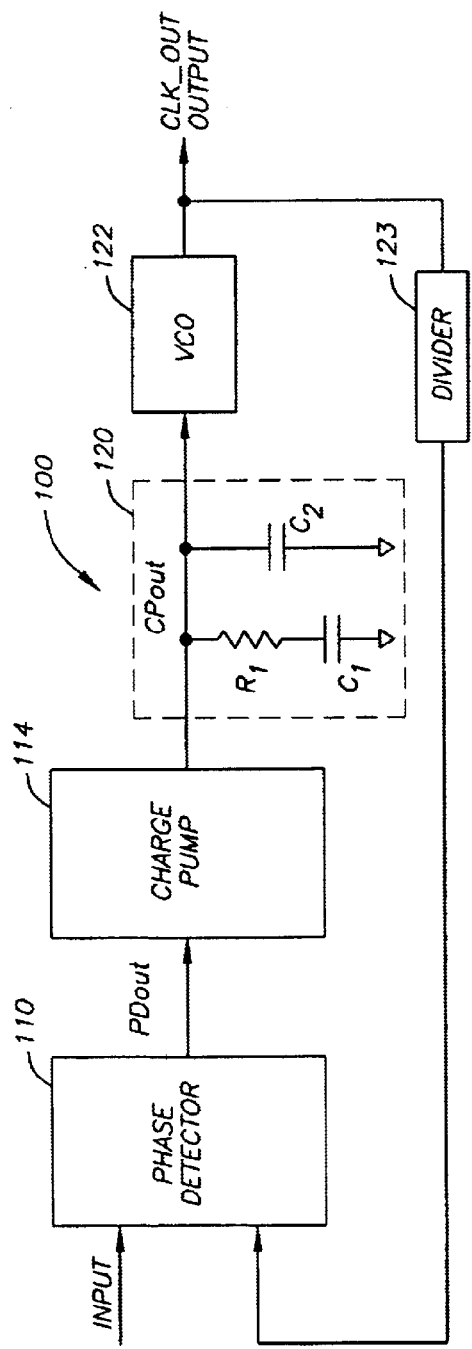
FIG. 1 is a functional block diagram of a phase lock loop using a charge pump in accordance with the prior art.
Figure 2:
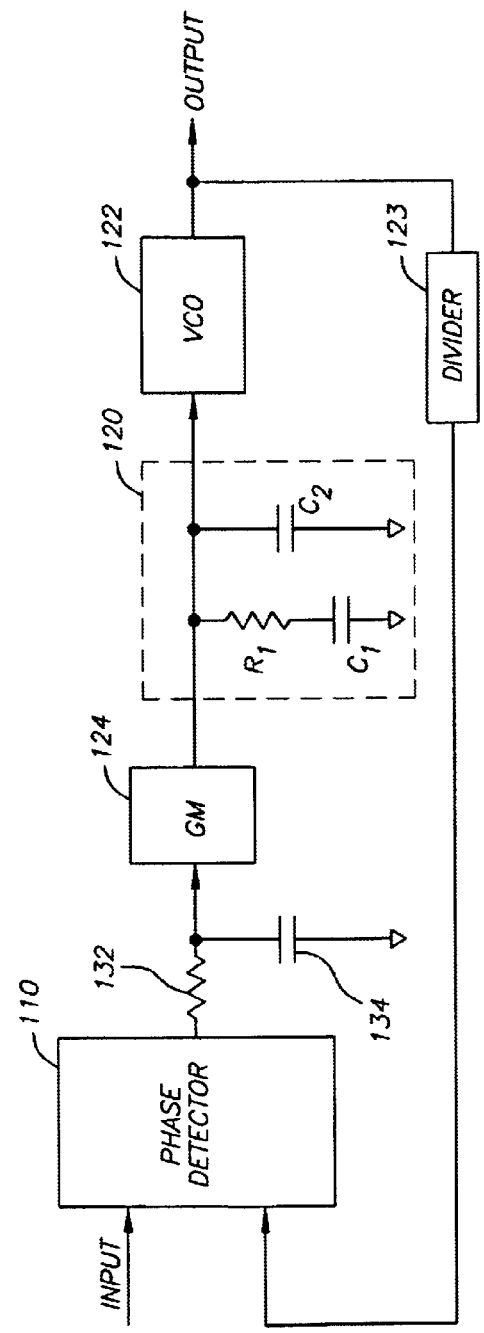
FIG. 2 is a functional block diagram of a phase lock loop using a transconductance amplifier as disclosed in Application Serial No. 09/540,243.

FIG. 4 is a functional block diagram of a phase lock loop in accordance with one embodiment of the invention which is similar to the phase lock loop of FIG. 2, but with the addition of a DAC 138 between the transconductance amplifier 124 and the loop filter 120. Similarly, FIG. 5 is a functional block diagram of another embodiment of the invention similar to the phase lock loop of FIG. 1 with the addition of a DAC 138 between charge pump 114 and loop filter 120.

As noted above, in order to change the bandwidth W0, and consequently the acquisition time of the PLL, one can change the gain of the transconductance cell 124. This is easily implemented using a current DAC at the output of the transconductance cell as shown in FIG. 4. If N represents the current gain of the DAC, then $$W0 = Kpd * gm * N * R1 * Kvco.$$

Accordingly, during the fast acquisition period, the digital input of DAC 138 is increased (e.g., quadruple) and hence the bandwidth is increased and the settling time is shortened. A digital signal, "fast lock" is provided as an input to the PLL which will provide a new set of digital input to the DAC, so that PLL is reverted to its operating bandwidth.

Figure 5:
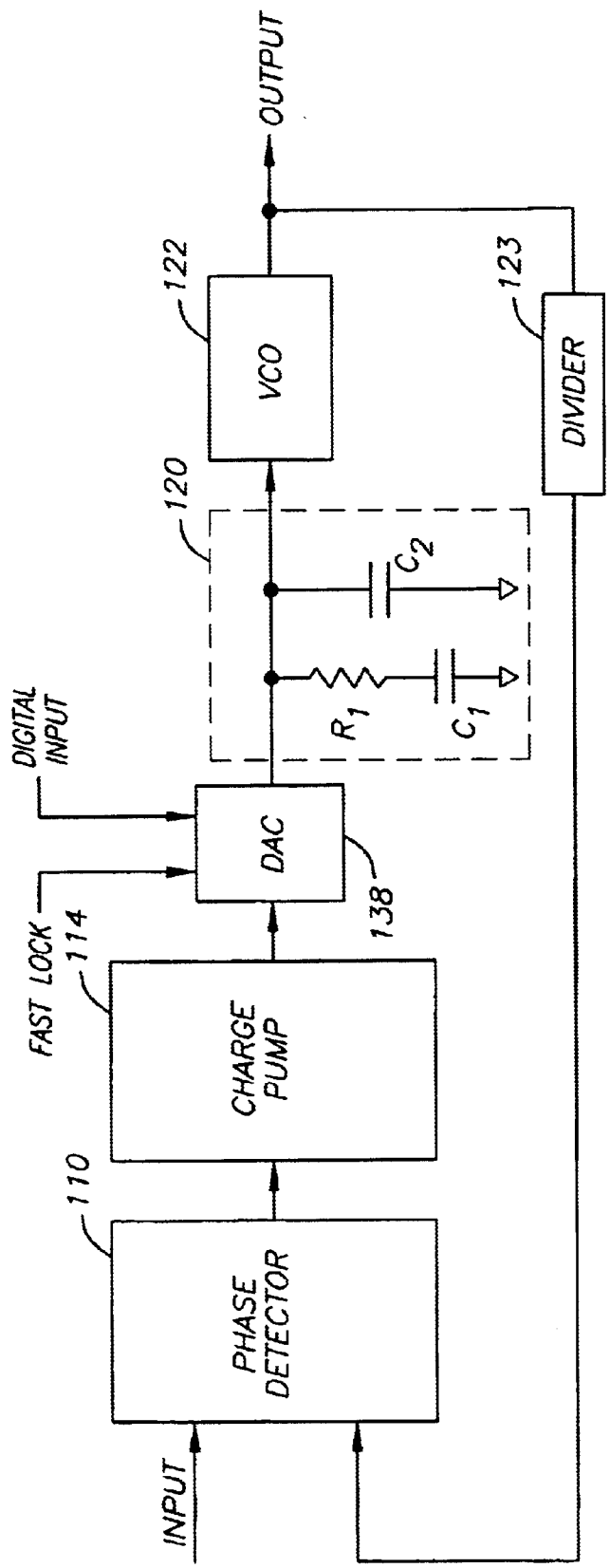
FIG. 5 is a functional block diagram of a phase lock loop filter using a DAC in accordance with another embodiment of the invention.

Utilization of DAC 138 is applicable with the charge pump 114, as shown in FIG. 5, as well as with the transconductance amplifier 124 shown in FIG. 4. Dividers 123 are shown in both circuits but are optional.

In FIG. 4 a pole and zero can be provided before the transconductance amplifier 124 with series resistor 132' and shunt capacitor 134' as described in application Ser. No. 09/615,033, now U.S. Pat. No. 6,389,092. By providing a new pole Wp1 before transconductance amplifier 124, the stability of the phase lock loop during bandwidth adjustment is improved.

Figure 6:
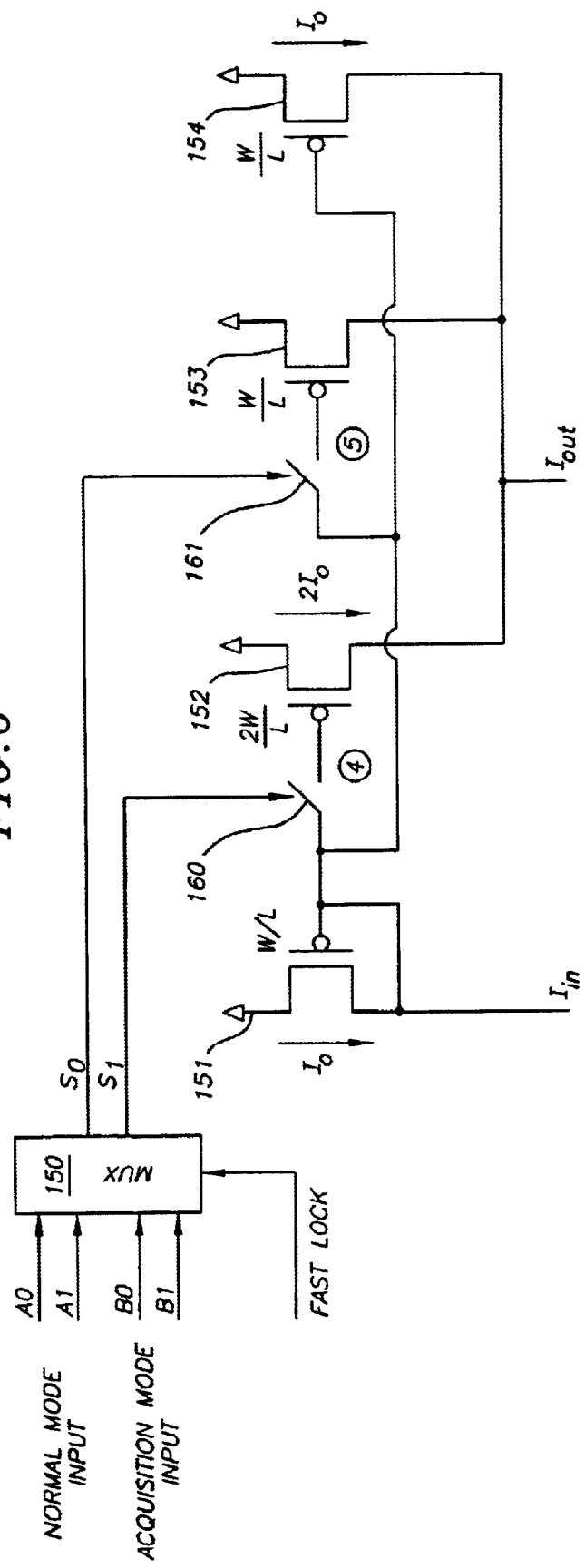
FIG. 6 is a schematic of a DAC as used in the PLLs of FIGS. 4 and 5.

FIG. 6 is a schematic of a 2-bit single-ended binary DAC which can be used in the PLL circuits of FIGS. 4 and 5. The invention is not limited to the DAC of FIG. 6 and can be used in conjunction with any curent DAC with any number of bits and with any decoding scheme (binary, thermometer, etc.). For simplicity a single-ended DAC is described, but a differential DAC can be used.

Two sets of 2-bit digital data ($A_0$, $A_1$; $B_0$, $B_1$) are provided to MUX 150 along with a fast lock signal, one of which is selected and connected to current DAC. These two bits will allow the PLL to have four different bandwidth values during normal and acquisition mode, so that the user can adjust the bandwidth not only for normal mode but also the acquisition mode.

The current $I_0$ is provided to transistor 151 and if switch 160 is closed (S1=high), transistor 152 will provide $2I_0$ since its size $$\left(\frac{2W}{L}\right)$$

is twice as large as transistor 151. Similarly, if switch 161 is closed (SØ=high), transistor 153 will provide $I_0$ since its size $$\left(\frac{W}{L}\right)$$

is equal to transistor 151. Transistor 154 always provides $I_0$ out. The truth table below describes the DAC function:

| S1 | SØ | Transistor 2 current | Transistor 3 current | $I_{out}$ |
|---|---|---|---|---|
| Low | Low | Ø | Ø | $I_0$ |
| Low | High | Ø | $I_0$ | $2I_0$ |
| High | Low | $2I_0$ | Ø | $3I_0$ |
| High | High | $2I_0$ | $I_0$ | $4I_0$ |

Use of the DAC in the phase lock loop in accordance with the invention has a number of advantages over the prior art.

1. The PLL loop has a zero, Wz1, and a pole, Wp1, due to the loop filter. These pole and zero are given by the following first order equations: Wz1=1(R1*C1), Wp1=1(R1*C2). As it can be seen from these equations, both Wz1 and Wp1 are inversely proportional to R1, whereas the bandwidth is directly proportional. On the other hand, the stability of the PLL loop depends on the ratio of Wp1 and W0. Hence, in the traditional implementation where R1 is increased to shorten the settling time, this ratio is changed in square law fashion (Wp1/W0=1/(K1*Kvco*C2*R1^2)). In accordance with the invention, however, R1 is kept constant, and N is varied, therefore, Wp1/W0 does not change as much and the PLL does not become unstable.

2. In the traditional case, switches are needed to connect and disconnect appropriate resistors, These switches are connected to most sensitive part of the PLL, namely the VCO control voltage. Any noise on this node translates directly to jitter at the output of the PLL. Each time these switches are turned on and off, charge is injected on this sensitive node. In accordance with the invention, these switches are in the DAC and away from this node.

3. By putting a switch in series with R1, the effective resistance is increased by the Ron of the switch. (R1 eff=R1+Ron). In some applications, R1 can be a small resistor in the same order of magnitude as Ron. The value of R1 is basically determined from the required W0, Kvco, and K1. Since R1 depends on the resistivity parameter and Ron on the MOSFET parameters, and since these parameters can vary from one wafer to another independently, the worst case variation of the effective R1 is increased. With the invention, there are no switches in series with R1, and hence this above problem is also alleviated.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A phase locked loop comprising:
a phase detector coupled to receive an input signal and a reference signal and to provide an output signal indicative of a difference between the input signal and the reference signal;
a low pass filter defining a loop pole and coupled to receive the output signal from the phase detector and to provide a filtered detector output signal;
a transconductance (gm) amplifier coupled to receive the filtered detector output signal from the low pass filter and to generate a conditioned signal output;
a digital to analog converter coupled to receive the conditioned signal output from the gm amplifier and to provide an analog output signal;
a second filter coupled to receive the analog output signal from the digital to analog converter and to filter the analog output signal;
a voltage controlled oscillator coupled to receive the filtered analog output signal from the second filter and to provide an oscillator signal in response to the filtered analog output signal; and
a feedback circuit coupled to receive the oscillator signal from the voltage controlled oscillator and to provide the reference signal based on the oscillator signal to the phase detector.

2. The phase locked loop as defined by claim 1, wherein the second filter providing the filtered analog output signal to the voltage controlled oscillator comprises a loop filter.

3. The phase locked loop as defined by claim 2 wherein the loop filter comprises a serially coupled resistor and capacitor and wherein the resistor is connected to a circuit ground through the capacitor and a second capacitor connected in parallel with the serially coupled resistor and capacitor.

4. The phase locked loop as defined by claim 3 wherein the loop filter defines a zero and a pole for the phase locked loop.

5. The phase locked loop as defined by claim 1 wherein the feedback circuit includes a divider.

6. In a phase locked loop in which loop bandwidth, Wo, is increased from an operating value to an acquisition value for loop phase acquisition, a method of changing bandwidth including:
receiving an input signal and a reference signal;
generating a detector output signal indicative of a difference between the input signal and the reference signal;
providing the detector output signal to a low pass filter defining a loop pole, the low pass filter generating and providing a filtered detector output signal to a transconductance (gm) amplifier;
generating by the gm amplifier a conditioned signal based on the filtered detector output signal;
providing the conditioned signal from the gm amplifier to a digital to analog converter (DAC) to generate an analog output signal; and
providing the analog output signal to a second filter, the second filter generating and providing a filtered analog output signal to a voltage controlled oscillator;
wherein the loop bandwidth is changed by changing a current gain of the digital to analog converter.

7. The method as defined by claim 6 wherein the current gain is changed by changing a digital input to the digital to analog converter.

8. A phase locked loop comprising:
a phase detector receiving an input signal and a reference signal and providing an output signal indicative of a difference between the input signal and the reference signal;
a low pass filter defining a loop pole and coupled to receive the output signal from the phase detector and to provide a filtered detector output signal;
a transconductance (gm) amplifier coupled to receive the filtered detector output signal from the low pass filter and to generate a conditioned signal output;
a digital to analog converter (DAC) coupled to receive the conditioned signal output from the gm amplifier and a first control signal and to provide an analog output signal, the DAC operating in a first mode in response to a first value being provided by the first control signal and in a second mode in response to a second value being provided by the first control signal;
a voltage controlled oscillator coupled to receive the analog output signal from the DAC and to provide an oscillator signal in response to the analog output signal; and
a feedback circuit coupled to receive the oscillator signal from the voltage controlled oscillator and to provide the reference signal based on the oscillator signal to the phase detector.

9. The phase locked loop of claim 8, wherein the first mode is a loop phase acquisition mode and the second mode is a non-acquisition mode.

10. The phase locked loop of claim 9, wherein bandwidth associated with the loop increases from an operating value bandwidth to an acquisition value bandwidth in response to the DAC changing from the non-acquisition mode to the loop phase acquisition mode.

11. The phase locked loop of claim 10, wherein the acquisition value bandwidth varies based on a second control signal input to the DAC.

12. The phase locked loop of claim 11, wherein the operating value bandwidth varies based on a second control signal input to the DAC.

13. The phase locked loop of claim 8, wherein the DAC is further operative in a third mode and in a fourth mode.

14. The phase locked loop of claim 13, wherein the DAC comprises a plurality of transistors to selectively operate a one of the first, second, third, and fourth modes.

15. The phase locked loop of claim 8, wherein the DAC comprises a plurality of transistors to selectively operate a one of the first and second of the DAC.

16. The phase locked loop of claim 15, wherein the plurality of transistors comprise one transistor having a size that is about twice as large as any other transistor.

17. The phase locked loop of claim 16, wherein at least one of the plurality of transistors produces at least a part of any analog output signal provided from the DAC to the voltage controlled oscillator.

18. The phase locked loop of claim 15, wherein at least one of the plurality of transistors produces at least a part of any analog output signal provided from the DAC to the voltage controlled oscillator.

19. The phase locked loop of claim 8, wherein the DAC comprises first, second, third, and fourth transistors to selectively operate the various modes of the DAC.

20. The phase locked loop of claim 19, wherein the first, second, and third transistors each has a first transistor size and wherein the fourth transistor has a second transistor size.

21. The phase locked loop of claim 19, wherein the second transistor size is about twice as large as the first transistor size.

22. The phase locked loop of claim 20, wherein the at least one of the first, second, and third transistors produces at least a part of any analog output signal provided from the DAC to the voltage controlled oscillator.

23. A method for eliminating a source of jitter in a phase locked loop including a loop filter with one or more switches, the one or more switches producing jitter in the phase locked loop in response to one of the switches being activated for changing a loop bandwidth from a first value to a second value, the method comprising:

receiving an input signal and a reference signal;

generating an output signal indicative of a difference between the input signal and the reference signal;

filtering the output signal;

providing the filtered output signal to a transconductance (gm) amplifier;

generating by the gm amplifier a conditioned signal based on the filtered output signal;

providing the conditional signal from the gm amplifier to a digital to analog converter (DAC) in the phase locked loop; and using the DAC to change the loop bandwidth from the first value to the second value, wherein the DAC replaces the one or more switches in the loop filter and effectively reduces jitter during the change of the loop bandwidth.

24. The method of claim 23, wherein the loop bandwidth changes from the first value to the second value based on an output analog signal produced by the DAC.

* * * * *